(12) United States Patent
Cecchi et al.

(10) Patent No.: US 7,268,400 B2
(45) Date of Patent: Sep. 11, 2007

(54) TRIPLE-WELL CMOS DEVICES WITH INCREASED LATCH-UP IMMUNITY AND METHODS OF FABRICATING SAME

(75) Inventors: Delbert R. Cecchi, Rochester, MN (US); Toshiharu Furukawa, Essex Junction, VT (US); Jack Allan Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/340,344

(22) Filed: Jan. 26, 2006

(65) Prior Publication Data

US 2007/0170516 A1 Jul. 26, 2007

(51) Int. Cl.
*H01L 29/76* (2006.01)
(52) U.S. Cl. ............... 257/371; 257/372; 257/E27.063; 257/E27.067
(58) Field of Classification Search ................ 257/369, 257/371, 372, 374, 379, E27.062, E27.067, 257/E27.108, E27.063
See application file for complete search history.

(56) References Cited

U.S. PATENT DOCUMENTS

| 5,889,315 A * | 3/1999 | Farrenkopf et al. ......... 257/552 |
| 6,927,442 B2 * | 8/2005 | Kaneko et al. ............. 257/299 |
| 2002/0063266 A1 * | 5/2002 | Lee ........................... 257/200 |

* cited by examiner

*Primary Examiner*—Minh-Loan Tran
(74) *Attorney, Agent, or Firm*—Schmeiser Olsen & Watts LLP

(57) ABSTRACT

A triple-well CMOS structure having reduced latch-up susceptibility and a method of fabricating the structure. The method includes forming a buried P-type doped layer having low resistance under the P-wells and N-wells in which CMOS transistors are formed and forming a gap in a buried N-type doped layer formed in the P-wells, the is gap aligned under a contact to the P-well. The buried P-type doped layer and gap in the buried N-type doped layer allow a low resistance hole current path around parasitic bipolar transistors of the CMOS transistors.

8 Claims, 7 Drawing Sheets

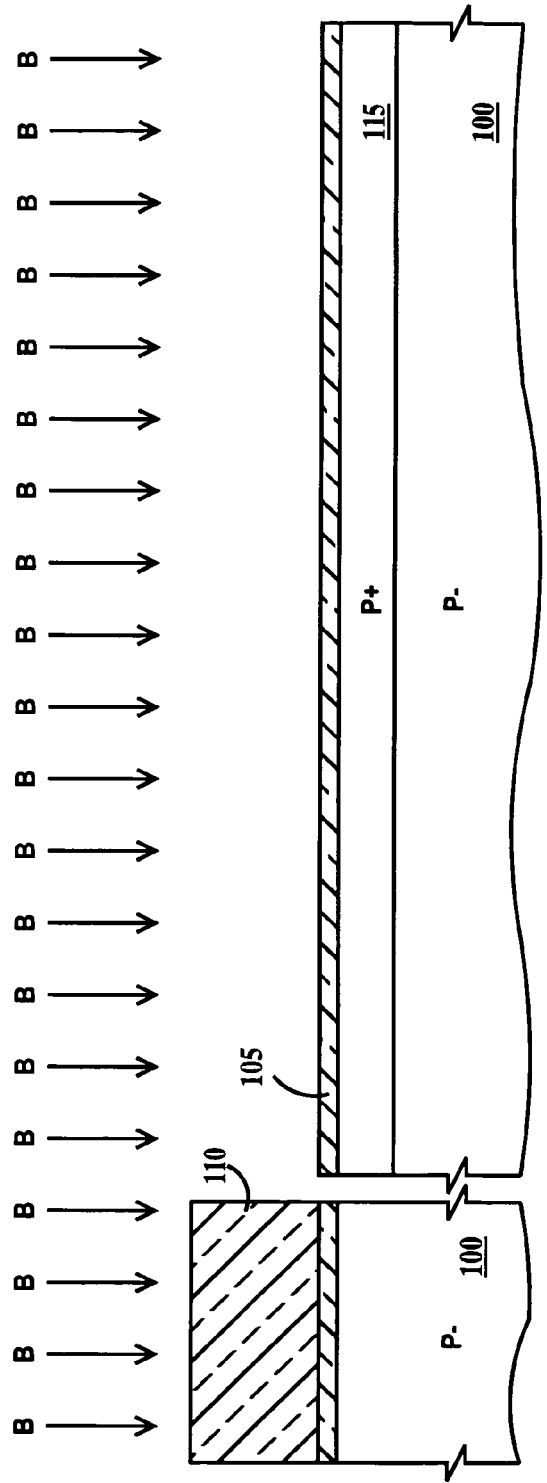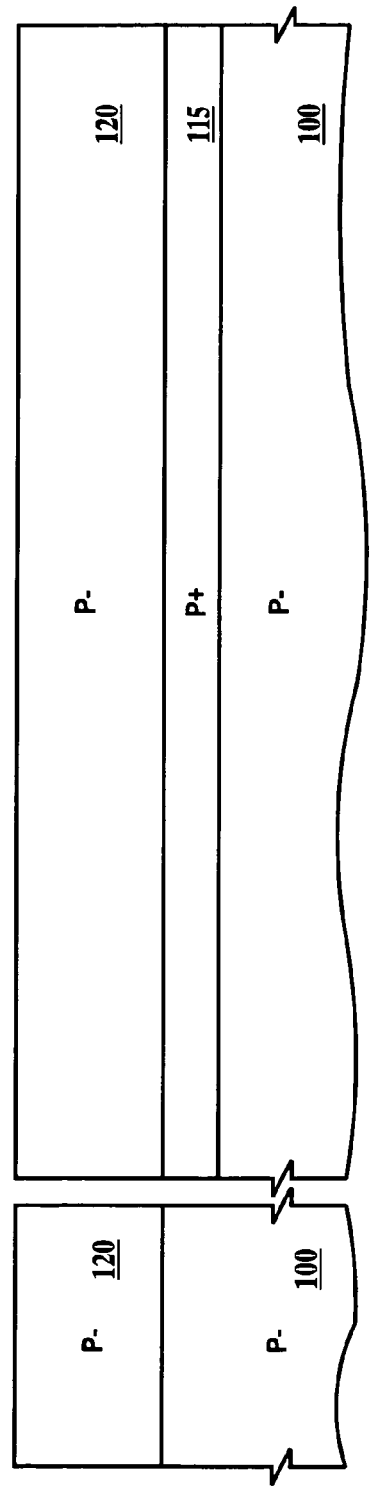
FIG. 1A
FIG. 1B

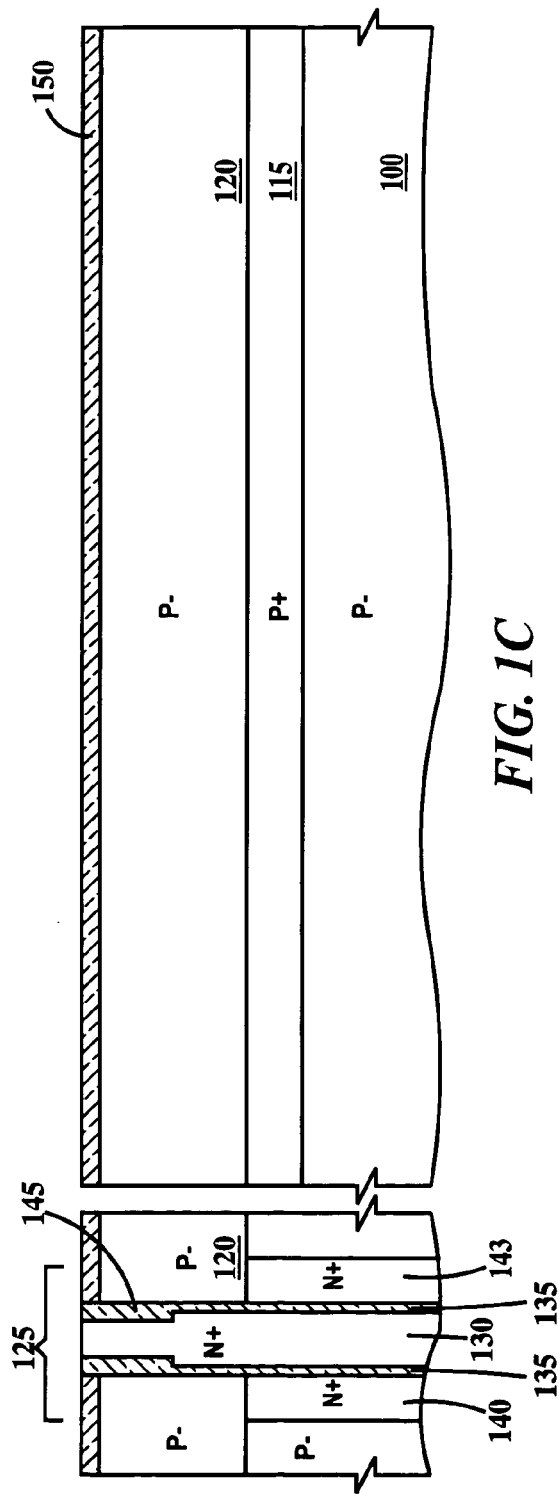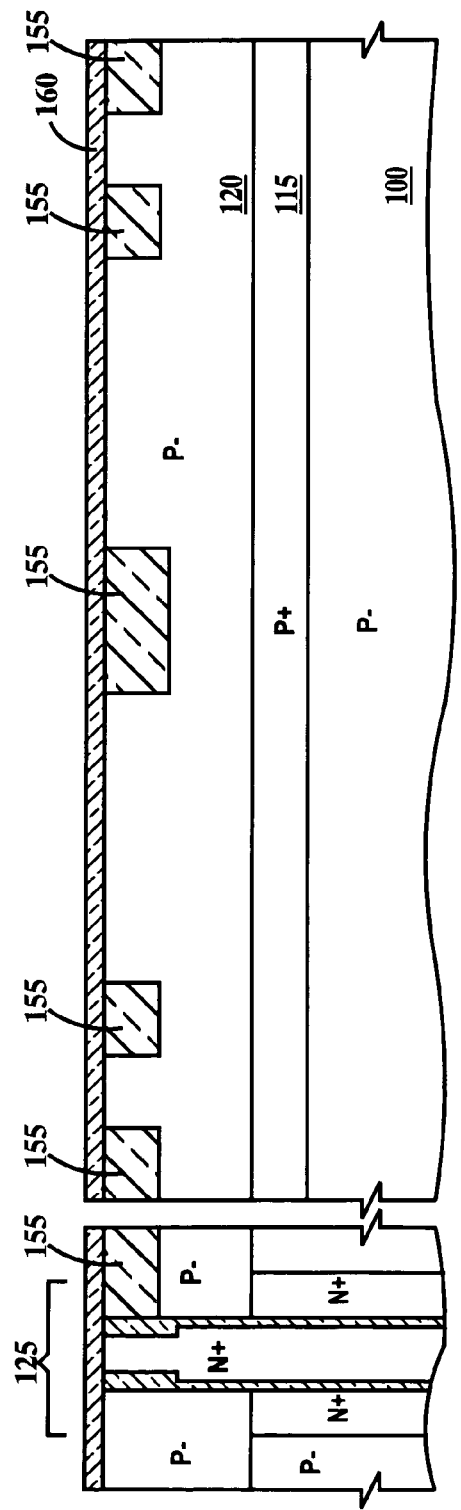

US 7,268,400 B2

TRIPLE-WELL CMOS DEVICES WITH INCREASED LATCH-UP IMMUNITY AND METHODS OF FABRICATING SAME

FIELD OF THE INVENTION

The present invention relates to the field of complimentary metal-oxide-silicon (CMOS) devices; more specifically, it relates to triple-well CMOS device structures and methods of fabricating triple-well CMOS device structures.

BACKGROUND OF THE INVENTION

Advanced embedded dynamic random access memories (EDRAMs) are fabricated with lightly P-type doped substrates using triple well structures in order to form buried diffused capacitor plates and to isolate the charge transfer NFET of the EDRAM. However, the combination of lightly P-type doped substrates and triple well structures includes parasitic NPN and PNP bipolar transistors in adjacent NFETs and PFETs which can form a parasitic latch and can go into latch-up mode (high current flow with feedback) when charge pairs are generated, for example, by heavy ions striking the sources, drains or wells of adjacent NFETs and PFETs or by unanticipated voltage variations in the power supplies feeding the sources, drains or wells of adjacent NFETs and PFETs. Latch-up, when it occurs, can result in catastrophic failure of the devices in which it occurs and even regions of the integrated circuit chip containing the latched-up devices. Therefore, there is a need for triple-well CMOS device structures with increased latch-up immunity and methods of fabricating triple-well CMOS device structures with increased latch-up immunity.

SUMMARY OF THE INVENTION

A first aspect of the present invention is a structure, comprising: a buried P-type doped layer in a P-type silicon substrate, a top surface of the buried P-type doped layer a first distance below a top surface of the substrate; an N-well and a P-well, both the N-well and the P-well extending from the top surface of the substrate to the top surface of the buried P-type doped layer; a buried N-type doped layer in the P-well, a bottom surface of the buried N-type doped layer in contact with the top surface of the buried P-type doped layer, the buried N-type doped layer extending from the top surface of the buried P-type doped layer toward the top surface of the substrate a second distance, the second distance less than the first distance; a PFET formed in the N-well and an NFET formed in the P-well; a P-type contact formed in the P-well and an N-type contact formed in the N-well, both the P-type contact and the N-type contact extending from the top surface of the substrate into the substrate respective third and fourth distances, the third and fourth distances less than a fifth distance between the top surface of the buried N-type doped layer and the top surface of the substrate; and a gap in the buried N-type doped layer, the gap aligned under the P-type contact, the P-well contacting the top surface of the buried P-type doped layer in the gap.

A second aspect of the present invention is a method, comprising: forming a P-type doped layer in a P-type silicon substrate, the P-type doped layer extending to a top surface of the substrate; forming an epitaxial layer on a top surface of the substrate, a top surface of the buried P-type doped layer a first distance below a top surface of the epitaxial layer; forming an N-well and a P-well in the epitaxial layer, both the N-well and the P-well extending from a top surface of the epitaxial layer to a top surface of the buried P-type doped layer; forming a buried N-type doped layer in the P-well, a bottom surface of the buried N-type doped layer in contact with the top surface of the buried P-type doped layer, the buried N-type doped layer extending from the top surface of the buried P-type doped layer toward the top surface of the epitaxial layer a second distance, the second distance less than the first distance; forming a PFET in the N-well and forming an NFET in the P-well; forming a P-type contact in the P-well and forming an N-type contact in the N-well, both the P-type contact and the N-type contact extending from the top surface of the epitaxial layer into the epitaxial layer respective third and fourth distances, the third and fourth distances less than a fifth distance between the top surface of the buried N-type doped layer and the top surface of the epitaxial layer; and forming a gap in the buried N-type doped layer, the gap aligned under the P-type contact, the P-well contacting the top surface of the buried P-type doped layer in the gap.

A third aspect of the present invention is a method of reducing latch-up in a CMOS device comprising: forming an N-well and an adjacent P-well in a silicon substrate; forming a PFET and a N-type contact in the N-well, forming an NFET and a P-type contact in the P-well; forming a buried N-type doped layer in the P-well, the CMOS device including a parasitic bipolar NPN transistor, an emitter of the parasitic bipolar NPN transistor comprising a source of the NFET, a base of the parasitic bipolar NPN transistor comprising a region of the P-well under the NFET, and a collector of the parasitic bipolar NPN transistor comprising the buried N-type doped layer and the N-well; and increasing a latch-up holding voltage of the CMOS device above a power supply voltage level supplied to the CMOS device by channeling holes around the bipolar NPN transistor parasitic transistor and into the P-well contact.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 1A through 1I are cross-sectional views illustrating fabrication of CMOS devices according to embodiments of the present invention.

DETAILED DESCRIPTION OF THE INVENTION

Figure 1E:
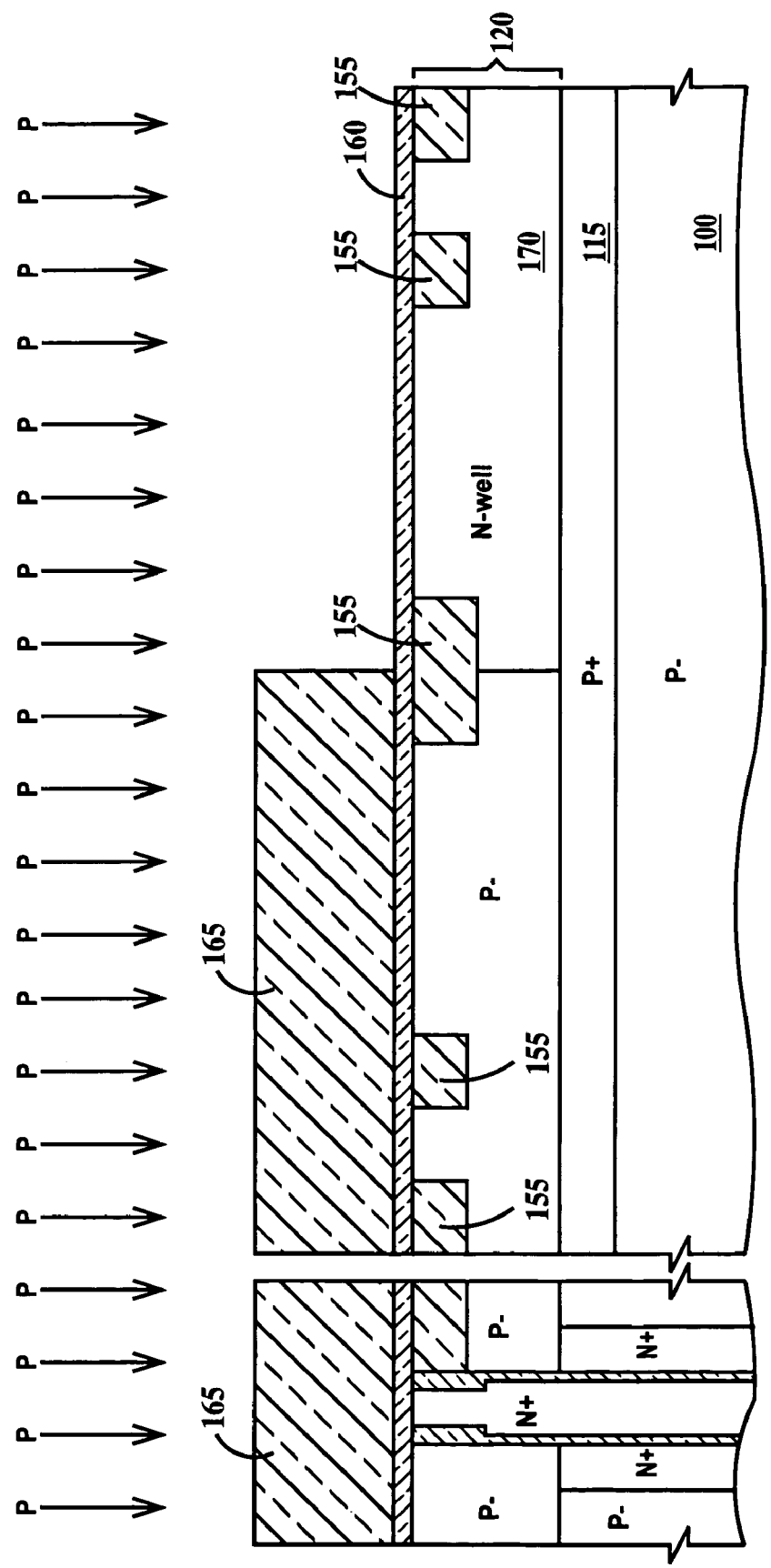

FIGS. 1A through 1I are cross-sectional views illustrating fabrication of CMOS devices according to embodiments of the present invention. In FIG. 1A, formed on a lightly doped P-type mono-crystalline silicon substrate 100 is a dielectric layer 105. In one example, substrate 100 is doped to a concentration between about $1E16$ atm/cm$^3$ and about $5E16$ atm/cm$^3$. In one example dielectric layer 105 is thermally grown silicon dioxide about 1 nm to about 10 nm thick. Formed on dielectric layer 105 is a patterned photoresist layer 110. In one example, patterned photoresist layer 110 may be formed by applying a layer of photoresist on dielectric layer 105, exposing the photoresist layer to actinic radiation through a patterned photomask, and developing the exposed photoresist layer to remove some regions of the exposed photoresist layer while leaving other regions of the exposed photoresist layer. Then a P-type ion-implantation is performed into substrate 100 to form highly P-doped regions (a P-band) 115 in substrate 100 wherever the ion implantation is not blocked by photoresist layer 110.

There are several exemplary options for forming regions 115. In a first option, boron in the form of 11B+ ions (illustrated in FIG. 1A) is implanted at a dose between about 1E15 atm/cm$^2$ and about 5E15 atm/cm$^2$ at an energy between about 2 KeV and about 10 KeV. In a second option, the 11B+ ion implant just described may be proceeded by a germanium (Ge) ion implantation (not illustrated in FIG. 1A) at a dose between about 1E14 atm/cm$^2$ and about 1E15 atm/cm$^2$ and an energy between about 10 KeV and about 25 KeV. The Ge ion implantation imparts a degree of amorphousness to the substrate, allowing higher dopant concentrations. In a third option, boron in the form of 49BF$_2^+$ ions (not illustrated in FIG. 1A) is implanted at a dose between about 1E15 atm/cm$^2$ and about 5E15 atm/cm$^2$ at an energy between about 10 KeV and about 50 KeV. In a fourth option, the 49BF$_2^+$ ion implant just described may be proceeded by a Ge ion implantation (not illustrated in FIG. 1A) at a dose between about 1E14 atm/cm$^2$ and about 1E15 atm/cm$^2$ and an energy between about 10 KeV and about 25 KeV In FIG. 1B, after removing photoresist layer 110 and dielectric layer 105 (see FIG. 1A) a lightly doped P-type epitaxial mono-crystalline silicon layer (epitaxial layer) 120 is formed over substrate 100. In one example epitaxial layer 120 is between about 1.5 microns and about 3.0 microns thick. In one example, epitaxial layer 120 is doped to a concentration of about 1E16 atm/cm$^3$ to about 5E16 atm/cm$^3$.

In FIG. 1C, a trench capacitor 125 is formed in regions of substrate 100 and epitaxial layer 120 not containing P-band 115. Trench capacitor 125 comprises a N-type doped polysilicon core (or inner capacitor electrode) 130 surrounded by a thin dielectric layer 135, which in turn is surrounded by a diffused highly N-type doped region (or buried outer plate) 140. A collar 145 comprising a thick dielectric layer is formed at the top of the capacitor. A dielectric layer 150, formed over epitaxial layer 120, prior to formation of capacitor 125 is used in the formation of the capacitor.

In one highly simplified example, trench capacitor 125 is formed by, etching a trench through epitaxial layer 120 into substrate 100 using dielectric layer 150 as a hard mask. Then a thin arsenic (As) doped glass layer is deposited on lower portions of the sidewalls of the trench and heated to drive the As into substrate 100 (but not into epitaxial layer 120) to form buried outer plate 140. Then dielectric layer 135, collar 145 and inner capacitor electrode 130 are formed. Formation of inner capacitor electrode 130 includes a polysilicon deposition and chemical-mechanical polishing step using dielectric layer 150 as a polish stop.

In FIG. 1D, regions of shallow trench isolation (STI) 155 are formed in epitaxial layer 120. STI 155 may be formed by etching trenches in epitaxial layer 120 using dielectric layer 150 (see FIG. 1C) as a hardmask, depositing a dielectric material such as and oxide formed by chemical vapor deposition (CVD) from tetraethoxysilane TEOS followed by a CMP step using dielectric layer 150 (see FIG. 1C) as a polish stop. Dielectric layer 150 (see FIG. 1C) is removed and a dielectric layer 160 is formed over epitaxial layer 120 and STI 155. In one example, STI 155 extends between about 0.2 microns and about 0.5 microns into epitaxial layer 120.

In FIG. 1E, a patterned photoresist layer 165 is formed on a top surface of dielectric layer 160 and then an N-type ion-implantation is performed into epitaxial layer 120 to form N-wells 170 in epitaxial layer 120 wherever the ion implantation is not blocked by photoresist layer 165. N-well 170 extends to and contacts P-band 115. In one example, the N-dopant is a phosphorus containing species and N-well 170 has an average dopant concentration between about 5E17 atm/cm$^3$ and about 5E18 atm/cm$^3$.

Figure 1G:
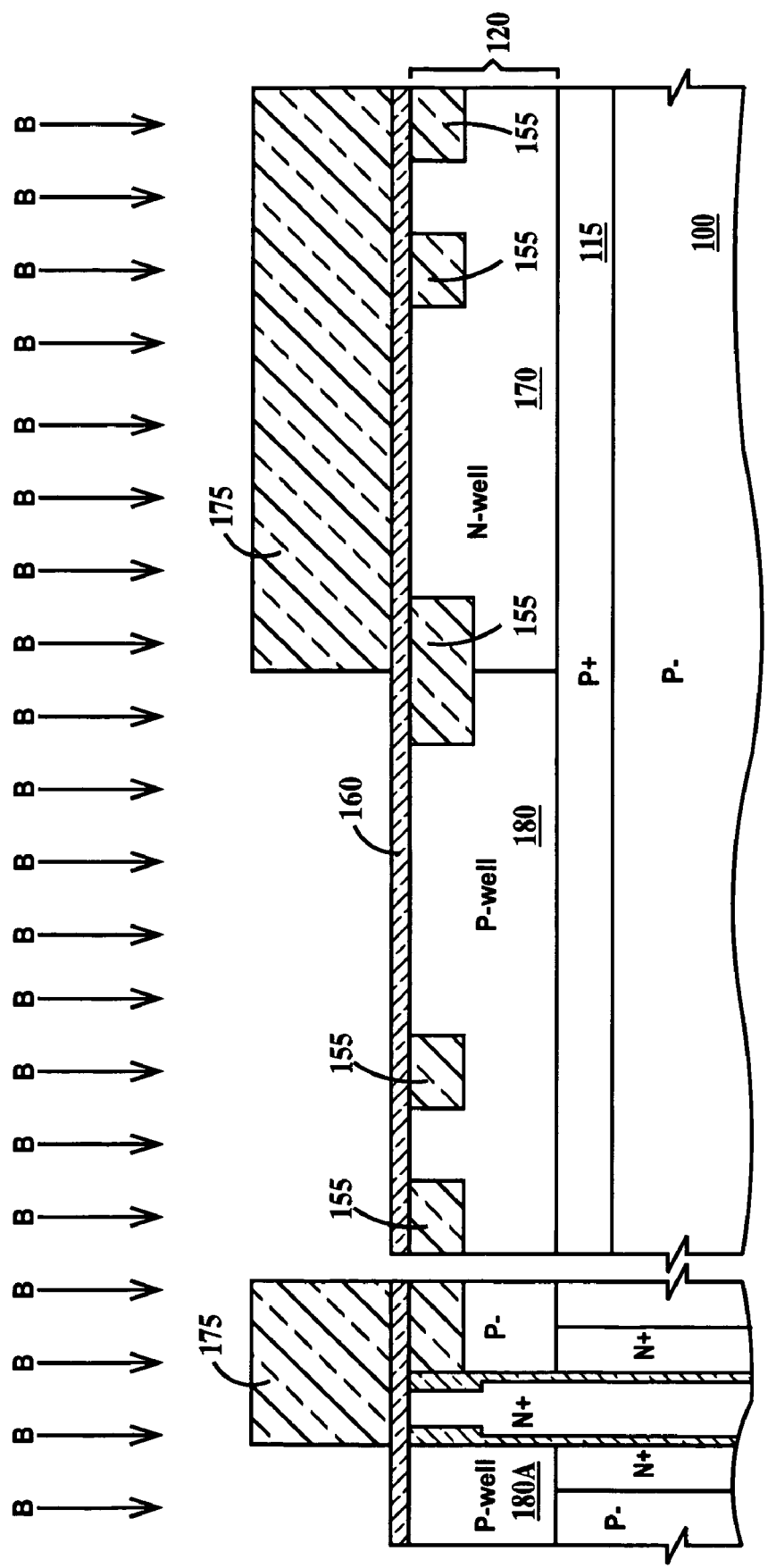

In FIG. 1G, after removing photoresist layer 165 (see FIG. 1E) a patterned photoresist layer 175 is formed and then a P-type ion-implantation is performed into epitaxial layer 120 to form P-wells 180 and 180A in epitaxial layer 120 wherever the ion implantation is not blocked by photoresist layer 175. P-well 180 extends to and contacts P-band 115. There is no P-band under P-well 180A. In one example, the P-dopant is a boron containing species and P-well 180 has an average concentration between about 5E17 atm/cm$^3$ and about 5E18 atm/cm$^3$.

In one example, after annealing processes (heating to temperatures in excess of about 800° C. (see discussion infra), P-band 115 has a boron concentration (if boron ion implantation was performed in 1A) between about 5E18 atm/cm$^3$ and about 1E21 atm/cm$^3$. In one example, the average resistivity of P-band 115 is less than about 0.1 ohm-cm.

Figure 1H:
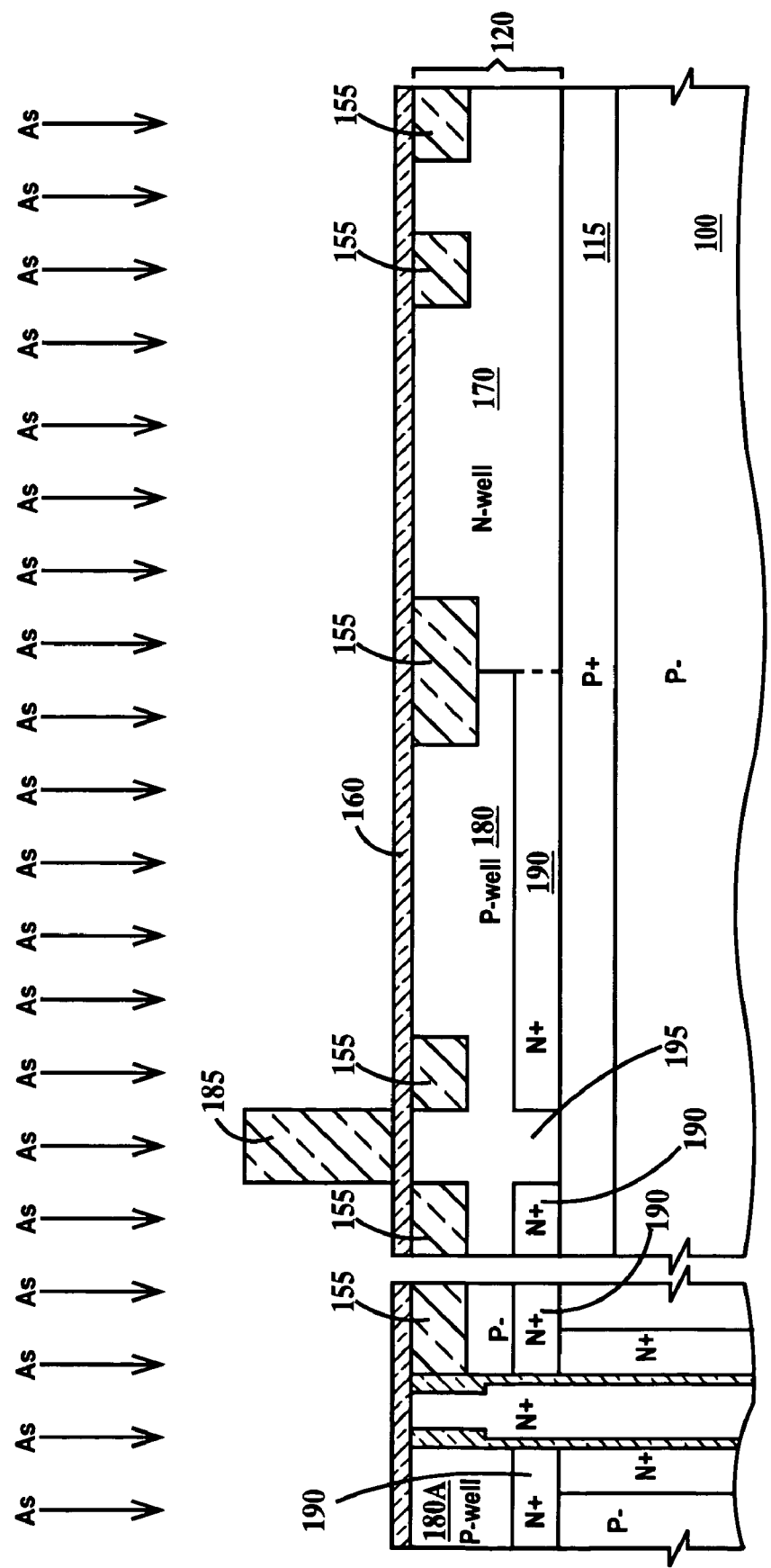

In FIG. 1H, after removing photoresist layer 175 (see FIG. 1G) a patterned photoresist layer 185 is formed on the top surface of dielectric layer 160 and then a N-type ion-implantation is performed into epitaxial layer 120 to form highly N-typed doped region (N-band) 190 in epitaxial layer 120 wherever the ion implantation is not blocked by photoresist layer 185. N-band 190 is formed only in P-wells 180 and 180A and contacts P-band 115 under P-well 180. Optionally, the N-band may laterally extend into a portion of, (or the entire) N-well. N-band 190 is formed below STI 155 and there is a continuous layer of P-well 180 (or P-well 180A) between N-band 190, STI 155 and between N-band 190 and a top surface of epitaxial layer 120. In one example the ion implantation implants phosphorus at a dose between about 5E13 atm/cm$^2$ and about 1E15 atm/cm$^2$ and an energy between about 750 KeV and about 1.25 MeV. In one example, the N-dopant is a phosphorus containing species and N-band 190 has an average concentration between about 1E17 atm/cm$^3$ and about 1E18 atm/cm$^3$. In one example, the thickness of N-band 190 is between 0.5 micron and about 1 micron.

Patterned photoresist layer 185 causes a gap 195 to be formed in N-band 190. Gap 195 is described in more detail infra.

Figure 1I:
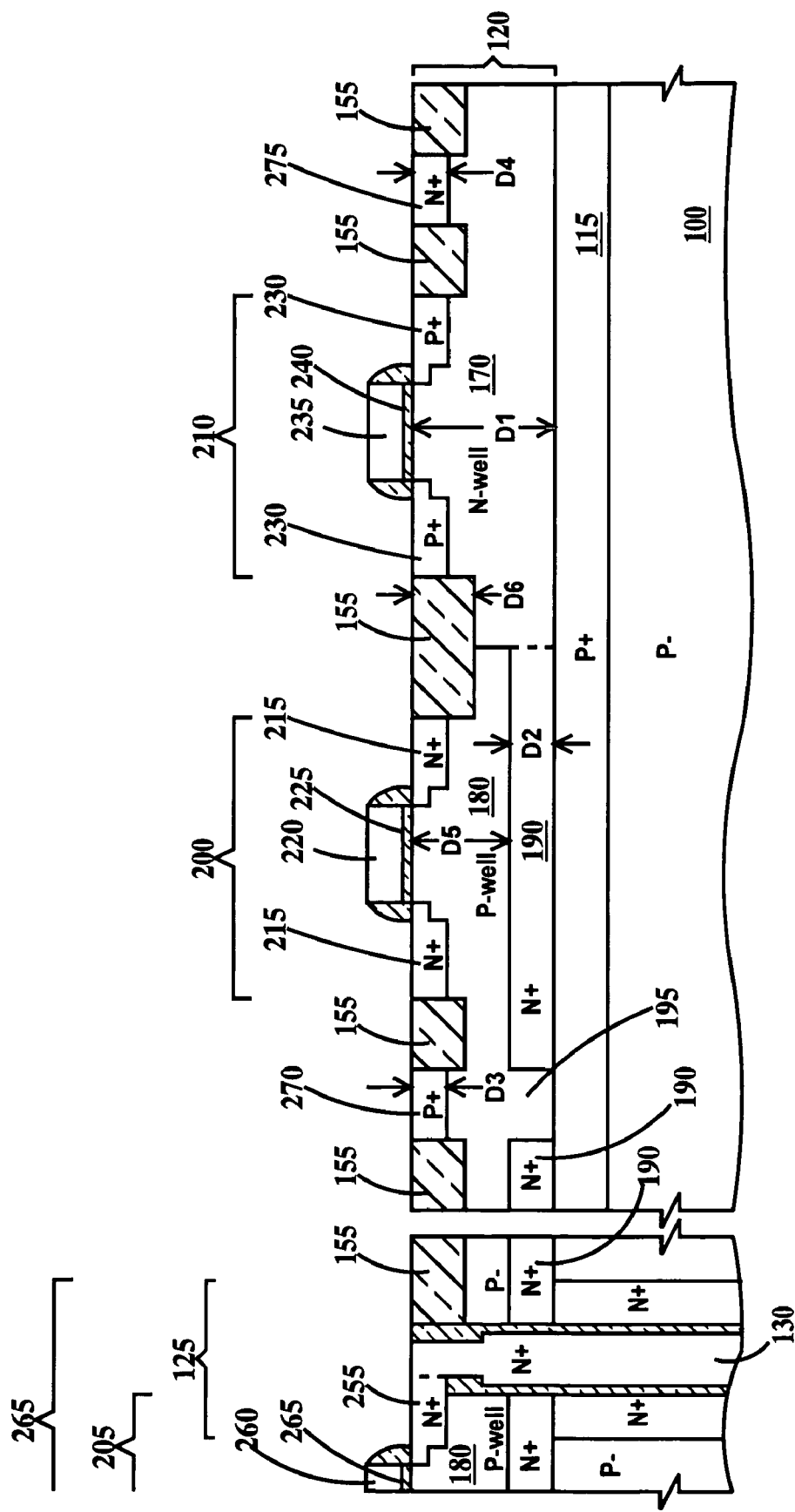

In FIG. 1I, NFETs 200 and 205 and a PFET 210 are formed by conventional processing as is well known in the art. NFET 200 comprises source/drains 215 and a gate electrode 220 over a gate dielectric 225. PFET 210 comprises source/drains 230 and a gate electrode 235 over a gate dielectric 240. NFET 210 comprises source/drains 255 and a gate electrode 260 over a gate dielectric 265. A source (255) of NFET 205 is physically and electrically connected to inner capacitor electrode 130 of capacitor 125 forming a memory cell 265. Though not illustrated, P-well 180A is electrically isolated from P-well 180 and N-well 170. P-well 180, P-well 180A and N-well 170 comprise a triple well structure. Memory cell 265 is exemplary of one memory cell of an EDRAM array.

A highly doped P-type contact diffusion (P-contact) 270 is formed in P-well 180 and a highly doped N-type contact diffusion (N-contact) 275 is formed in N-well 170. Gap 195 in N-band 190 is aligned under P-contact 270.

In FIG. 1I, a distance D1 is measured from the top surface of epitaxial layer 120 to a top surface of P-band 115. A distance D2 is measured between a bottom surface of epitaxial layer 120 and a top surface of N-band 190. A distance D3 is measured from a top surface of epitaxial layer 120 to a bottom surface of P-type contact diffusion 270. A distance D4 is measured from the top surface of epitaxial layer 120 to a bottom surface of N-type contact diffusion 275. A distance D5 is measured from the top surface of epitaxial layer 120 to the top surface of N-band 190. A distance D6 is measured from the top surface of epitaxial layer 120 to a bottom surface of STI 155. The following relationships hold: D1>D2, D1=D2+D5, D5>D3, D5>D4 and D5>D6.

Generally, annealing is performed after forming STI, P-wells, N-wells and other FET fabrication steps. However, the sequence and conditions of annealing steps may be advantageously arranged so a to minimize out-diffusion of P-band 115, maximize the dopant concentration of the P-band and minimize the electrical resistance of the P-band.

Figure 2:
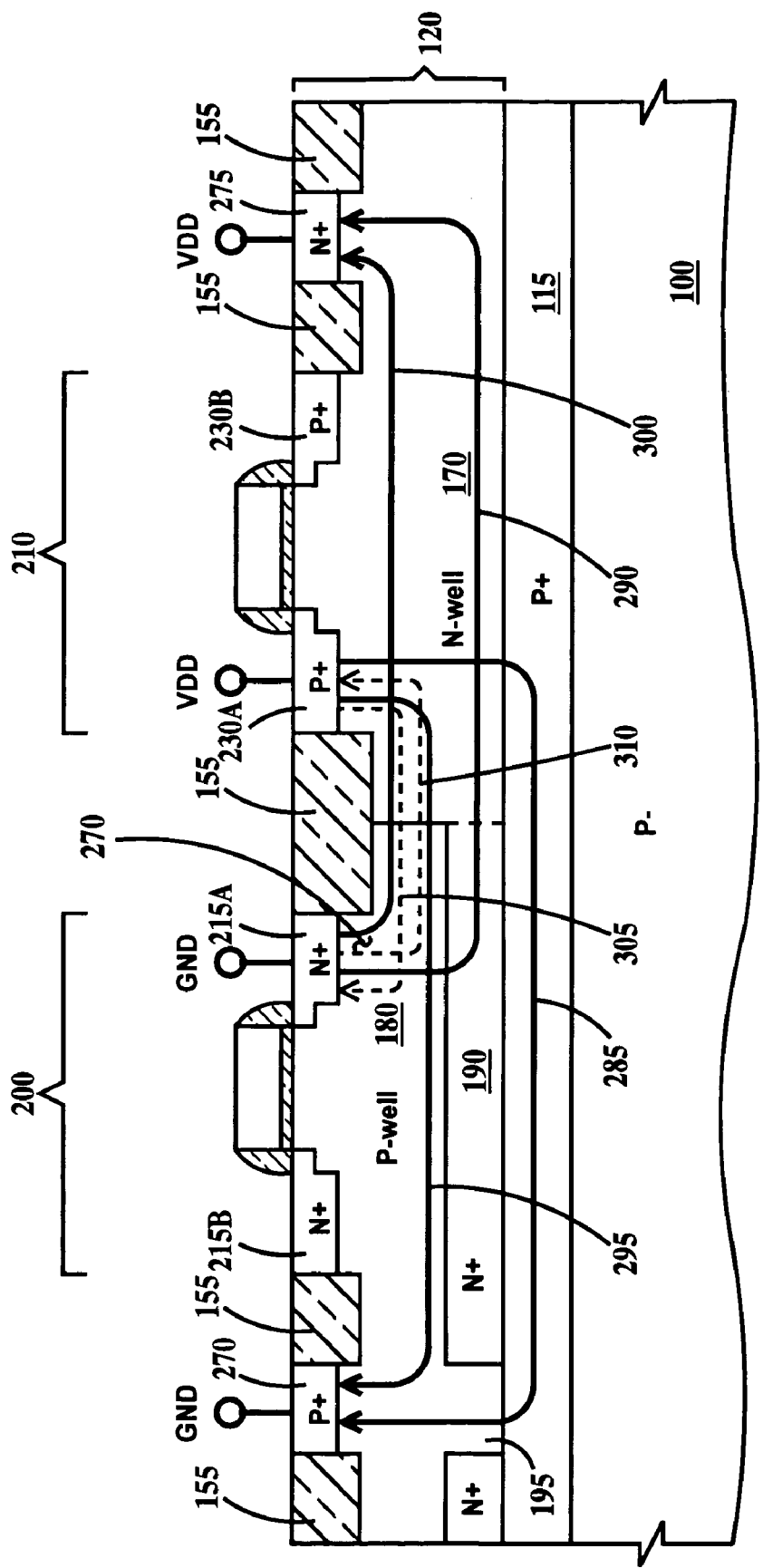
FIG. 2 is a cross-section view through a CMOS device according to embodiments of the present invention illustrating parasitic bipolar current flows.

FIG. 2 is a cross-section view through a CMOS device according to embodiments of the present invention illustrating parasitic bipolar current flows. In FIG. 2, an active base region 180 of a parasitic NPN bipolar transistor is located under the source 215A (because of the GND connection) of NFET 200. Similarly an active base region of a parasitic PNP bipolar transistor is located under the source 230A (because of the VDD connection) of PFET 210. Source 215A of NFET 200 forms the emitter of the parasitic bipolar NPN transistor and source 230A of PFET 210 forms the emitter of the parasitic bipolar PNP transistor. N-Band 190 and N-well 170 form the collector of the parasitic bipolar NPN transistor and P-well 180 forms the collector of the parasitic bipolar PNP transistor. In FIG. 2, parasitic current flows are illustrated by paths (the heavy lines) 285, 290, 295 and 300 and paths (the dashed lines) 305 and 310.

In path 285, holes are flowing from source 230A of PFET 210 through N-well 170 into P-band 115, then from P-band 115 through gap 195 into P-well 180 and then into P+ contact 270. In path 290, electrons are flowing from source 215A of NFET 200 through P-well 180 into N-band 190, then from N-band 190 through N-well 170 into N+ contact 275.

In path 295, a much lesser hole current (at least one order of magnitude less) than in path 285 is flowing from source 230A of PFET 210 through N-well 170 into P-well 180 then into P+ contact 270. In path 300, a much lesser electron current (at least one order of magnitude less) than in path 290 is flowing from source 215A of NFET 200 through P-well 180 into N-well 170 and then into N+ contact 275.

In path 305, a much lesser hole current (at least one order of magnitude less) than in path 295 is flowing from source 230A of PFET 210 through N-well 170 into P-well 180 then into source 215A of NFET 200. In path 310, a much lesser electron current (at least one order of magnitude less) than in path 300 is flowing from source 215A of NFET 200 through P-well 180 into N-well 170 and then into source 230A of PFET 210.

Path 285 is the most significant in terms of reducing the potential for latch-up. Path 285 effectively channels holes into P-well 180 around the parasitic NPN and increases the latch-up holding voltage above the CMOS transistor power supply voltage (VDD). Holding voltage is defined as the minimum voltage drop between emitter of PNP and emitter of NPN following the triggering of the latchup event. The holding voltage marks the lowest voltage point on the negative incremental resistance portion of the latchup current versus voltage curve. Path 285, having a much lower resistance than any of paths 290, 295, 300, 305 and 310 diverts holes that would otherwise go into a latch-up feedback loop (the active base region 180 of the parasitic bipolar NPN transistor) to ground. With degraded feedback current, the parasitic bipolar latch is much less likely to go into latch-up.

Thus, the embodiments of the present invention provide triple-well CMOS device structures with increased latch-up immunity and methods of fabricating triple-well CMOS device structures with increased latch-up immunity.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
    a buried P-type doped layer in a P-type silicon substrate, a top surface of said buried P-type doped layer extends a first distance below a top surface of said substrate;
    an N-well and a P-well, both said N-well and said P-well extending from said top surface of said substrate to said top surface of said buried P-type doped layer;
    a buried N-type doped layer in said P-well, a bottom surface of said buried N-type doped layer in contact with said top surface of said buried P-type doped layer, said buried N-type doped layer extending from said top surface of said buried P-type doped layer toward said top surface of said substrate a second distance, said second distance less than said first distance;
    a PFET formed in said N-well and an NFET formed in said P-well;
    a P-type contact formed in said P-well and an N-type contact formed in said N-well, both said P-type contact and said N-type contact extending from said top surface of said substrate into said substrate respective third and fourth distances, said third and fourth distances less than a fifth distance between said top surface of said buried N-type doped layer and said top surface of said substrate; and
    a gap in said buried N-type doped layer, said gap aligned under said P-type contact, said P-well contacting said top surface of said buried P-type doped layer in said gap.

2. The structure of claim 1, further including:
    an additional P-well, said buried N-type doped layer extending into said additional P-well;
    a trench capacitor formed in said additional P-well, said trench capacitor including an inner capacitor electrode separated from an outer plate by a dielectric layer, said trench capacitor extending from said top surface of said substrate, through said P-well and said N-type buried layer into said substrate; and
    an additional NFET formed in said additional P-well, a source of said additional NFET in electrical contact with said inner capacitor electrode of said trench capacitor.

3. The structure of claim 2, further including a buried N-doped outer plate surrounding said inner capacitor electrode, said outer plate extending from a bottom surface of said buried N-type doped layer into said substrate.

4. The structure of claim 1, further including:
dielectric filled trench isolation surrounding said N-well, said P-well, said N-type contact and said P-type contact, said trench isolation extending from said top surface of said substrate a sixth distance into said substrate, said sixth distance less than said fifth distance.

5. The structure of claim 1, wherein said buried P-type doped layer has an average resistivity of less than about 0.1 ohm-cm.

6. The structure of claim 1, wherein a dopant concentration of said buried P-type doped layer is greater than respective doping concentrations of said substrate, said P-well and said N-well.

7. The structure of claim 1, wherein:
said P-type substrate has an average dopant concentration between about 1 E16 atm/cm$^3$ and about 5E16 atm/cm$^3$;
said buried P-type doped layer has an average dopant concentration between about 5E18 atm/cm$^3$ and about 1E21 atm/cm$^3$ of boron;
said buried N-type doped layer has an has an average dopant concentration between about 1E17 atm/cm$^3$ and about 1E18 atm/cm$^3$;
said N-well has an average dopant concentration between about 5E17 atm/cm$^3$ and about 5E18 atm/cm$^3$; and
said P-well has an average dopant concentration between about 5E17 atm/cm$^3$ and about 5E18 atm/cm$^3$.

8. The structure of claim 1, wherein:
said N-well and said P-well have a thickness measured from said top surface of said substrate to said top surface of said buried P-type doped layer between about 1.5 microns and about 3.0 microns: and
said buried N-type doped layer has a thickness between about 0.5 microns and about 1.0 microns.

* * * * *